United States Patent [19]

Chaki

[11] 3,995,242

[45] Nov. 30, 1976

[54] TUNING DEVICE FOR SWITCHING A PLURALITY OF BROADCAST BANDS AND FOR SELECTING ANY OF THEM

[75] Inventor: Takao Chaki, Urawa, Japan

[73] Assignee: Clarion Co., Ltd., Tokyo, Japan

[22] Filed: Mar. 26, 1975

[21] Appl. No.: 562,232

[52] U.S. Cl. ............................... 334/7; 74/483 PB; 74/10.33; 334/53
[51] Int. Cl.² ...................... H03J 5/06; H03J 5/08; H03J 5/32
[58] Field of Search ............ 334/7, 84, 52, 53, 54, 334/8, 4; 74/483 PB, 10.33

[56] References Cited
UNITED STATES PATENTS

| | | |
|---|---|---|
| 3,415,129 | 12/1968 | Stamm ................................ 334/7 X |
| 3,634,791 | 1/1972 | Urawashi et al. ..................... 334/74 |
| 3,722,299 | 3/1973 | Knight et al. ........................ 334/7 |
| 3,832,907 | 9/1974 | Yasuda ................................ 334/7 |

*Primary Examiner*—Saxfield Chatmon, Jr.
*Attorney, Agent, or Firm*—Wallenstein, Spangenberg, Hattis & Strampel

[57] ABSTRACT

A push button type tuning device comprising a plurality of tuning coils each being made tunable with any of a plurality of receiving broadcast bands, selection levers any of which is selected and pushed in response to a desired broadcast band by operating each push button secured to a pointed end of each selection lever and tuning cores each being adapted to insert into or draw from any of said coils by the pushed selection lever.

12 Claims, 25 Drawing Figures

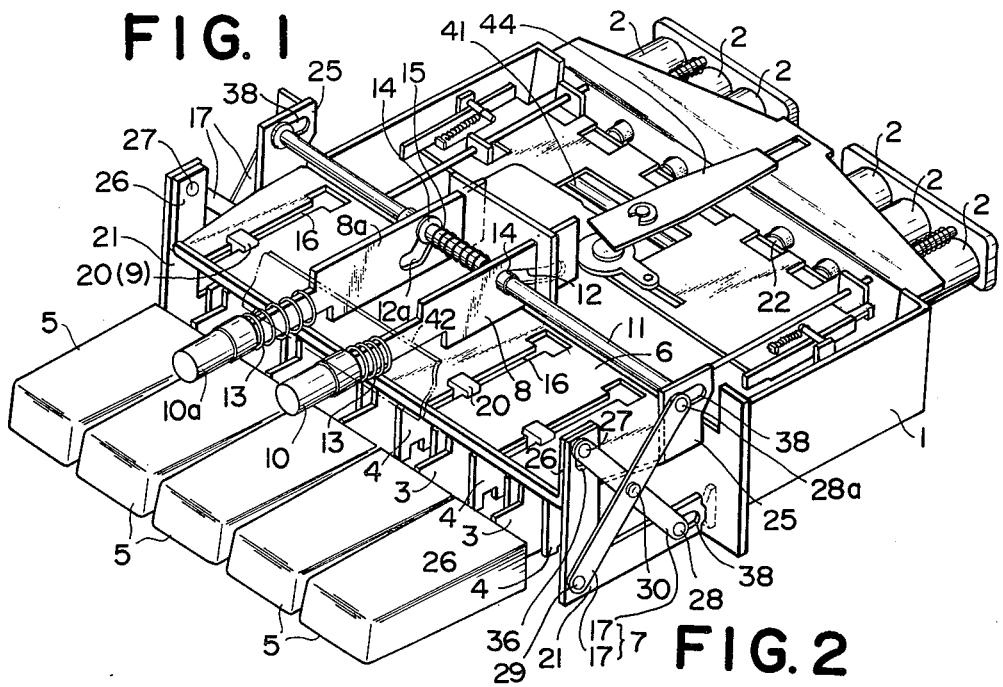

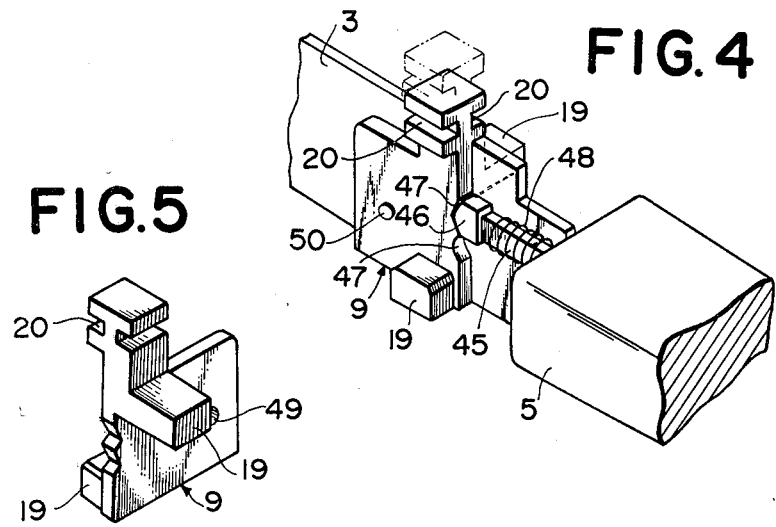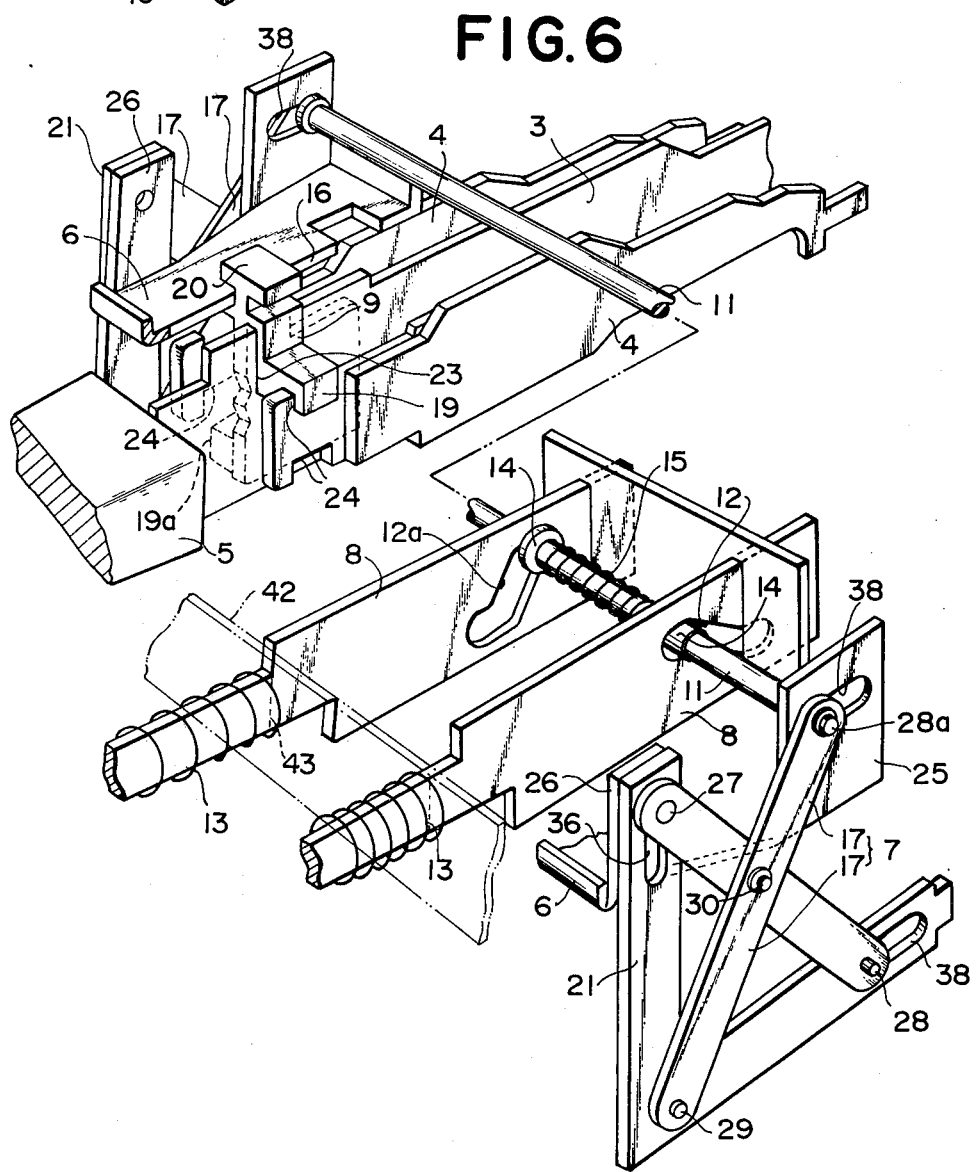

FIG. 7
FIG. 8
FIG. 9
FIG. 10
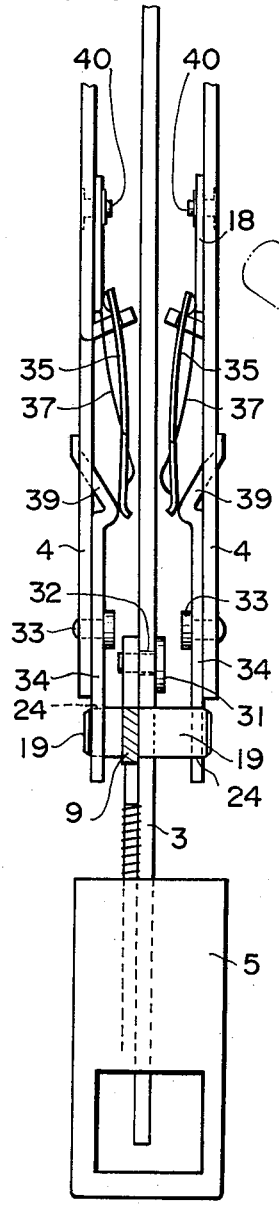
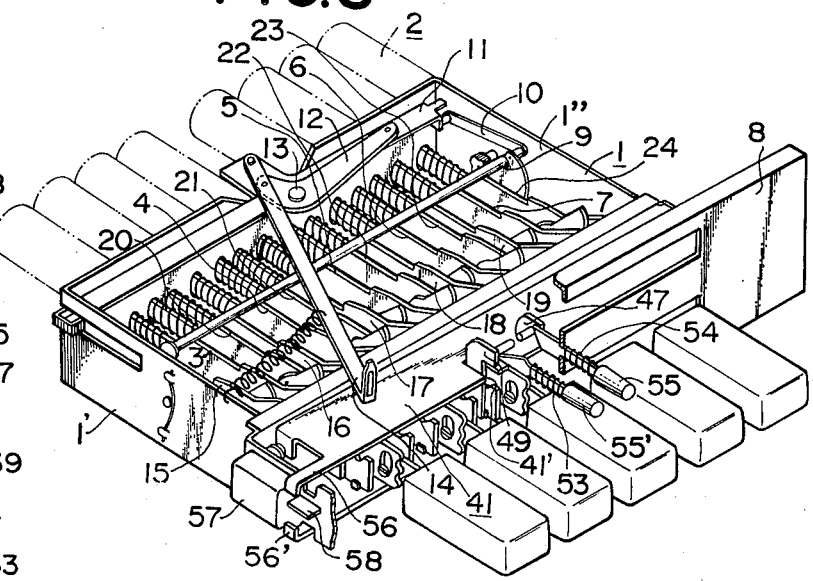
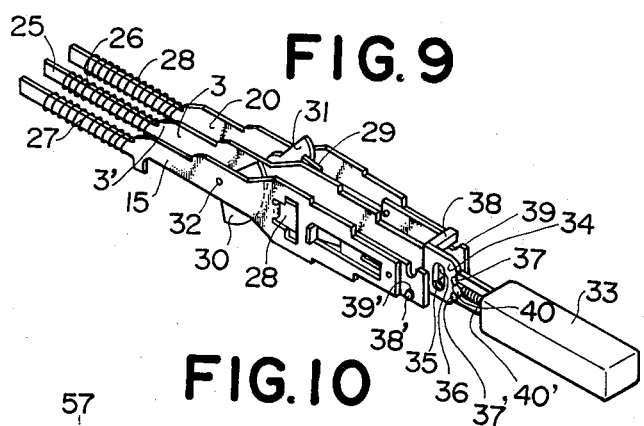
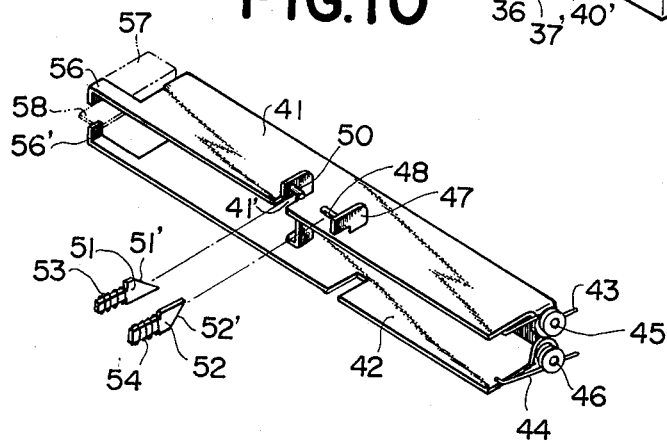

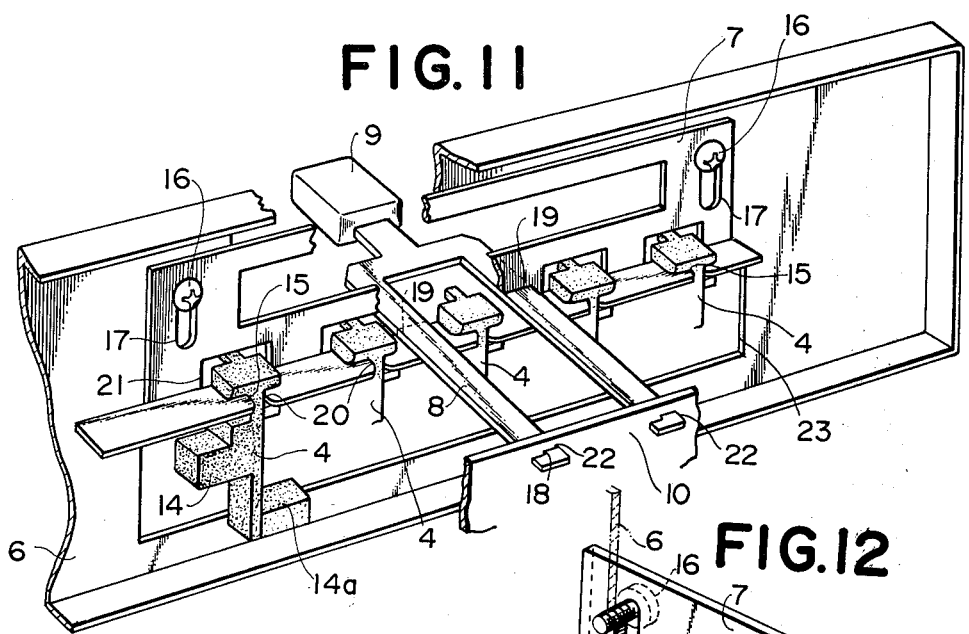
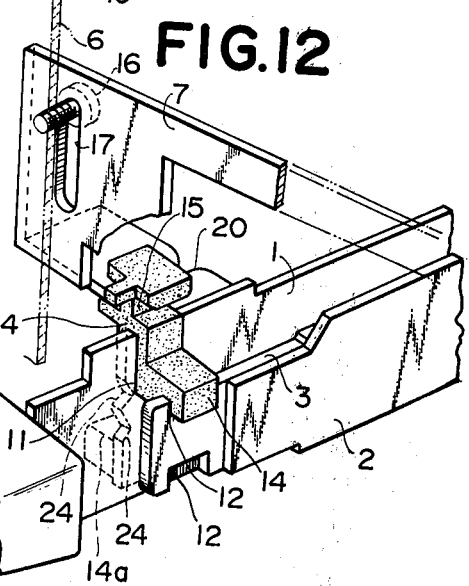
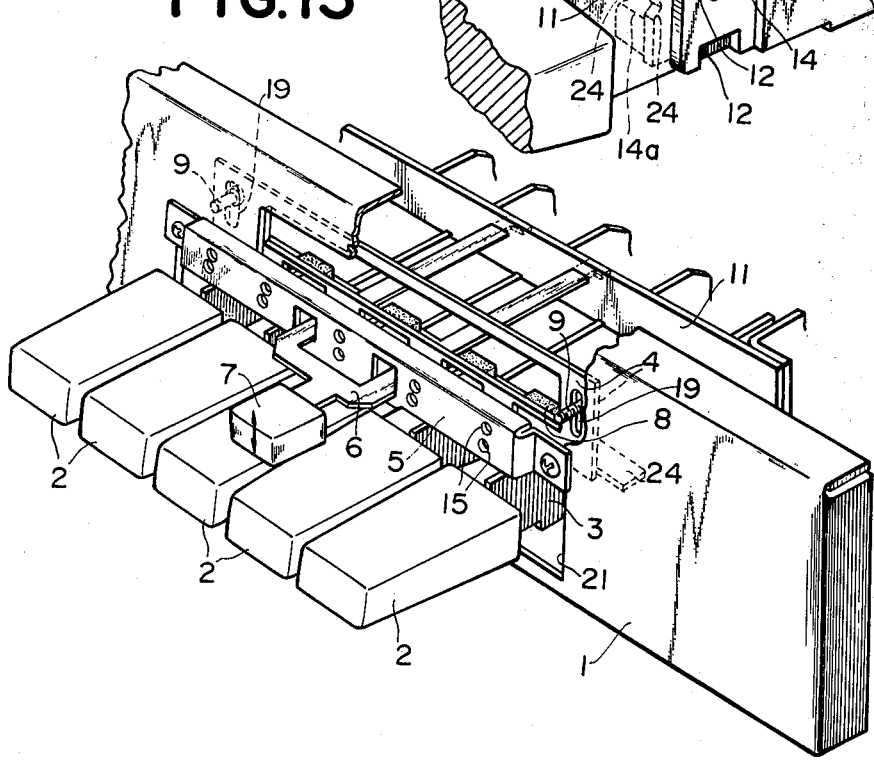

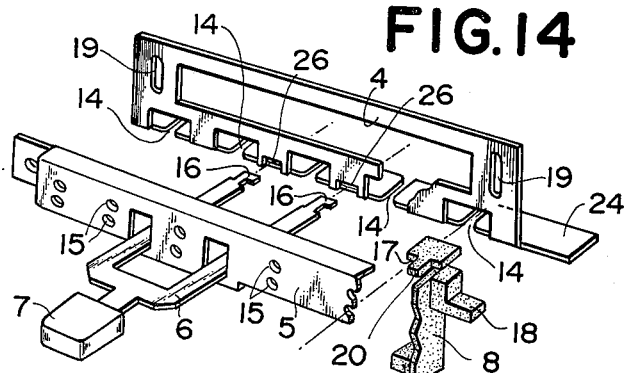
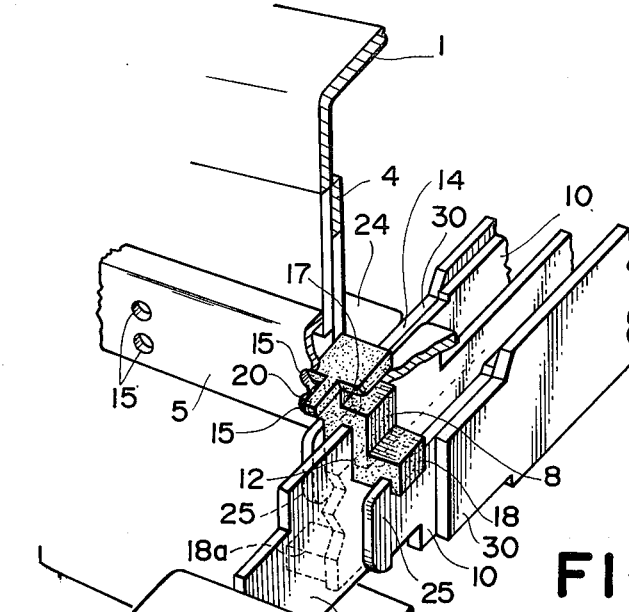
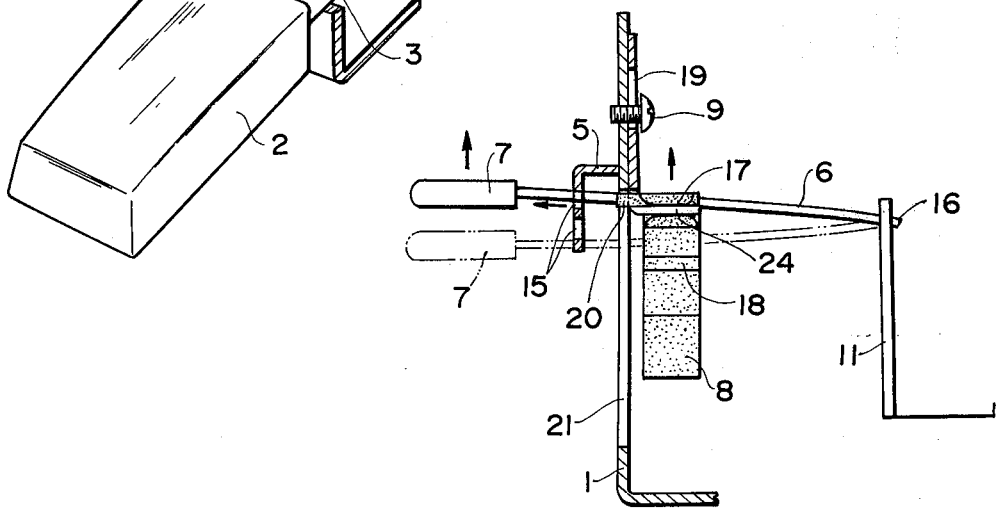

TUNING DEVICE FOR SWITCHING A PLURALITY OF BROADCAST BANDS AND FOR SELECTING ANY OF THEM

BACKGROUND OF THE INVENTION

1. The Field of the Invention

The present invention relates to a tuning device for switching a plurality of broadcast bands and for selecting any of them, and more particularly to the improvement wherein a receiving band switching mechanism having simple and easily operable construction is provided to smoothly effect switching operation for a plurality of broadcast bands.

2. Description of the Prior Art

In a conventional tuning device a mechanism for switching receiving bands does not necessarily have a good and desired function. That is, although such push button type tuning device is desired to be operable in the so-called "one-touch" manner, it is not adapted to carry out switching operation for receiving bands in the "one-touch" manner.

In addition, since said switching mechanism is provided with a lock mechanism for locking the respective switched conditions to effect selecting operation, it is necessary to switch from one switched condition to the other in releasing a locked condition. Accordingly, the construction of said switching mechanism is very complicated and its operation is not simple and easy.

SUMMARY OF THE INVENTION

A main object of the invention is to provide a tuning device capable of easily operating and smoothly switching by push buttons without using any lock mechanism. Another object of the invention is to provide a tuning device so constructed as to prevent error switching operation thereof.

A further object of the invention is to provide a tuning device wherein it is possible to adjust the stroke of tuning cores.

A still further object of the invention is to provide a tuning device wherein frequency definition plates are surely fixed at desired positions to prevent frequency deviation when selection of broadcast bands is effected.

In order to attain the above objects, a tuning device according to the invention is constructed as described hereinafter.

BRIEF DESCRIPTION OF THE DRAWINGS

FIG. 1 is a perspective view showing the mechanism of a push button type tuning device embodying the invention.

FIG. 2 is a perspective view showing the modification of a push button part for switching bands in said device shown in FIG. 1.

FIG. 3 is an enlarged perspective view partially indicating a push button, an arm and a selection lever shown in FIG. 1.

FIG. 4 is a perspective view indicating an engaging body part shown in FIG. 1 and a stopping body part for holding it in an up and down operated condition.

FIG. 5 is a perspective view showing only said engaging body part.

FIG. 6 is an enlarged perspective view showing a selection push button part and a slide member part of a band switching button in the Example 2 of the invention.

FIG. 7 is a plain view showing an arm and a selection lever relating to a selection push button in said Example 2.

FIG. 8 is a perspective view showing a push button type tuning device according to Example 3 of the invention.

FIGS. 9 and 10 are enlarged perspective views indicating main parts of a band switching mechanism in said Example 3.

FIG. 11 is a perspective view showing the inside of the front plate of the yoke in the Example 4 of the invention.

FIG. 12 is a perspective view partially showing a switching plate, an engaging body, a push button arm and a selection lever used in said Example 4.

FIG. 13 is a perspective view showing a main part of the Example 5 of the invention.

FIG. 14 is a perspective view showing a plate for preventing error operation and a switching plate in the Example 5 in dissolved state.

FIG. 15 is a perspective view indicating a slide metal fitting in drawn state so as to release holding of a frequency definition plate in said Example 5.

FIG. 16 is a sectional view showing an engaging body and a plate for preventing error operation in band switching state in said Example 5.

BRIEF DESCRIPTION OF THE PREFERRED EMBODIMENTS

Example 1

Figure 18:
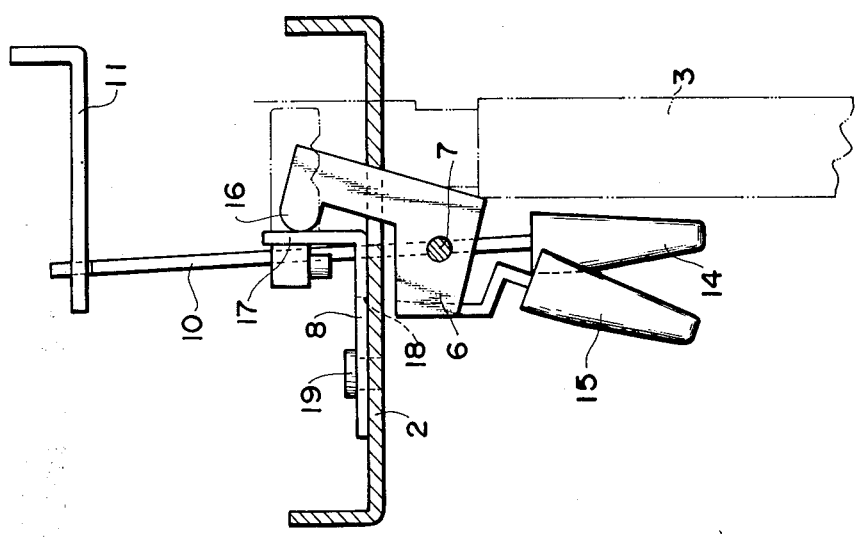
FIG. 18 is a plane view indicating the construction of the main part of said Example 6.

As shown in FIGS. 1 to 5, a plurality of tuning coils (2) adapted to be tunable for a plurality of receiving bands are provided in the inner part of a yoke 1. A plurality of push buttons for selection of the receiving bands are secured to arms 3 to insert or to take out tuning cores 22 into or of said coils, a pair of selection levers 4 being disposed at both sides of said arm 3. These selection levers 4 are provided with a frequency definition plate in such a way that the setting condition thereof may be changed and fixed. As in the prior art, said cores 22 are adapted to be inserted or taken out by rotating a rotatable yoke through such frequency definition plate so that a moving body cooperates with said rotatable yoke.

In the above arrangement, according to the invention, the engagement between the arm 3 and any one of said selection levers 4 disposed at both sides thereof may be changed by a band changing push button 10 as shown in FIG. 1 or 2 without employment of a specific lock mechanism, thereby to maintain the respective changed conditions. For this purpose, firstly, as shown in FIG. 1, a plate-shaped switching member 6 is secured to the upper portion of selection levers 4 and the arm 3 relative to a series of push buttons 5 and is adapted to be slidable in the longitudinal direction of the yoke 1, namely, in the direction crossing with the sliding direction of the push button 5, while in the illustrated cases, the push button 5 is adapted to be slidable before and behind the yoke 1, as will be described in detail hereinafter. The switching member 6 is provided with a plurality of slit-shaped guide holes 16 along the pushing direction of the push button 5 in alignment therewith and an ant-slit-like stopper 20 formed at the top of an engaging body 9 is slidably fitted with the guide hole 16. This engaging body 9 has an attaching hole 49 (FIG. 5) and is secured to said arm 3 by a stopper 50 (FIG. 4) inserted into the attaching hole 49, at the both sides of which a pair of engaging protrusions 19 is disposed as shown in FIGS. 3 and 14. One of these engaging protrusions 19 is formed at the upper portion thereof to face down but the other is formed at the lower portion thereof to face upward.

Further, with respect to such engaging body 9, selection levers 4 have a pair of engaging niches 24 formed at the bottom thereof as shown in FIG. 3, one thereof being arranged so that the engaging niche 24 at the upper portion thereof receives the downward engaging protrusion 19 and the other being arranged so that the engaging niche 24 at the lower portion thereof receives the upward engaging protrusion.

Band changing push buttons 10 (10a) are secured to action pieces 8 (8a) provided with tilted holes 12 (12a) formed in a crossing manner each other into which a manipulating rod 11 is inserted, said rod 11 being inserted into a horizontal long hole 38 at a pair of standing members 25 provided at both sides of the rear portion of said switching member 6. Another pair of standing members 26 is provided at the both sides of the front portion of this switching member 6 and coupled with an L-like bended upper portion of arm members 21 protruded from the yoke 1 and secured to one end portion of supporting mechanism 7 comprising two members 17 combined by a stopper 27 inserted into a vertical hole 36 which is formed at said upper portion, in a crossed manner. Both ends of said manipulating rod 11 are slidably mounted on the upper portion of the other member 17 along the hole 38 by a stopper 28a.

The center portions of said members 17 are coupled with each other by a connector 30 and the lower portion of one of the members 17 is secured to the bended corner portion of the arm member 21 by a connector 29. The other member 17 thereof is fixed to the standing member 26 by a pin passing through the vertical hole 36 formed at the upper end portion of the arm member 21 as described hereinbefore.

Moreover, each of said action piece 8, 8a is inserted into the front plate 42 of the yoke 1 and the front end thereof is equipped with push buttons 10, 10a. An elastic member 13 for recovering the push button and the action piece is disposed between the push buttons 10, 10a and the front plate 42. The portion of said manipulating rod 11 inserted into the tilted holes 12, 12a is provided with rotatable members 14, (FIG. 6) respectively, to obtain a proper guiding action and also an elastic member 15 is provided between these rotatable members 14. A reference numeral 41 (FIG. 1) shows one rod of the rotatable frame and a reference numeral 44 indicates a pointer operating member for showing selection condition of any band by a pointer.

Although the above example is so arranged that the switching member 6 is adapted to be movable in the up and down directions, it may be embodied so that the switching member is adapted to be movable in the horizontal direction by the above push buttons 10, 10a. That is, FIG. 2 shows a preferred embodiment having such arrangement wherein each action piece 8, 8a is formed in the horizontal condition and tilted holes 12 and 12a in the crossed direction are provided as illustrated, into which a manipulating members 11 are inserted in the perpendicular condition. In this way, when push buttons 10, 10a are pressed, the manipulating member 11 is slided in the left or right direction and then if the engaging rod 9 is operated by cooperating it with action of such manipulating rod 11, it will be apparent that the engagement between the arm 3 and each selection lever 4 may be switched in a similar manner.

In the above arrangement of the invention, any of selection levers 4 is pushed by the arm 3 when it is moved by pushing operation of the selection push button 5, to obtain a given selection tuning. In this case, to switch the cooperation relation between the arm 3 and each lever 4, any of the above push buttons 10, 10a is pushed. That is, FIGS. 1 and 2 show the condition that one of selection levers 4 is coupled with the arm 3 after the right push button 10 has been already pushed and the other is released. In order to change such condition another push button 10a is pushed and as a result the manipulating member 11 is pushed down through the tilted hole 12a of the action piece 8a, thus at least the inner portion of the switching member 6 is caused to go down. However, since this switching member 6 is supported by the supporting mechanism 7 comprising two members 17 combined in a crossed manner, going down of the stopper portion 28a thereof causes even the upper portion of the other member 17 through the connector 30 to go down by the same distance and thus the switching member 6 goes down remaining in the horizontal condition. In this way, going down of the member 6 causes to go down all the engaging bodies 9 stopped in the holes 16 whereby the engaging protrusion 19 provided on the one side of the bodies 9 engages with the upper engaging niche 24 in one of the selection levers 4 shown in FIG. 3 and the other engaging protrusion 19 provided on the other side of said bodies 9 is released from its engaged condition with respect to the lower engaging niche 24 in the other selection lever 4 to go down as shown in FIG. 3. Thereafter, if the push button 10 is pushed again, the switching relation opposite to the foregoing may be obtained.

As mentioned above, according to the invention, the switched condition corresponding to each band can be locked without a special lock means because each action piece 8, 8a tends to always protrude from the yoke 1 by the elastic member 13 mounted on the each push button 10, 10a. Moreover, each tilted direction of the tilted holes 12, 12a in the action pieces 8, 8a crosses each other and thus the direction of an active force applied to the manipulating member 11 inserted into the tilted hole 12 is opposite to that in the other hole 12a. That is, in the condition shown in FIG. 1, a pushing-down-force is applied to the manipulating member 11 by means of the upper rim of the tilted hole 12 while a pushing-up-force is applied to the same member 11 by means of the lower rim thereof. In this way, as a result of applying active forces of the opposite directions to the same member 11, said member can be locked in the respective positions supported by the supporting mechanism 7 without using a specific lock mechanism. This means that it is unnecessary to release such lock mechanism and to operate it after said member 11 reaches the switching position. Therefore, it will be apparent that the above described device has not only simple mechanism but also easy operability.

Example 2

FIGS. 6 and 7 show the main parts of Example 2 of the invention. As shown in FIG. 7, selection levers 4 are provided with frequency definition plates 18 secured to their top portions and holding plates 35 are disposed on the frequency definition plates 18 through elastic plates 37. The frequency definition plate 18 may be set by pushing up the basic end portion of the holding plate 35 along a slope portion formed at the top portion of a basic end member 34 attached to said selection lever 4 by a bolt and nut 33. An advance of any of the selection levers 4 with the frequency definition plates 18 by means of the push button 5 causes to rotate a rotatable yoke 41 so that through a moving body (not shown) cooperating with said yoke 41, said tuning cores 22 are inserted into or taken out of the coils 2.

In the above relation, to cause selected one of said selection lever 4 together with the push button arm 3 and to release this relation, the arm 3 is provided with an engaging body 9 being adapted to be slidable in the longitudinal direction of the yoke 1. For this purpose, a long hole 32 is formed at the position shown in FIG. 3 in the intermediate portion of said arm 3 in the lateral direction thereof and the engaging body 9 is assembled with a stopper 31 inserted into said hole 32. This engaging body 9 is provided with engaging portions 19 protruded at both sides thereof thereby to engage with or to be released from a engaging niche 24, one of said engaging portions 19 being protruded downwards at the upper portion thereof while the other being protruded upwards at the lower portion thereof.

Further, another engaging portion 20 of an ant-slit type is protruded from the top portion of the engaging body 9 and is fitted in a slit-like hole 16 formed at the switching plate 6 placed to cover the surface of the selection lever 4 and selection lever 3, said portion 20 being adapted to be slidable in the axial direction of said hole 16 and operated to move up and down therein by this switching plate as shown in FIG. 1. Standing members 25, 26 are provided at both sides of the above switching plate 6, respectively and are supported by couplers 27, 28. In this case, those couplers 27, 28 are attached to each upper portion of supporting members 17 disposed in a crossed manner. The intermediate parts of said supporting members 17 are coupled with each other by a coupler 30 to form a supporting mechanism 7 as a whole as shown in FIG. 6. In the lower part of said supporting mechanism 7, the lower end of one of the supporting members 17 is coupled by a coupler 29 with an L-shaped supporting arm 21 secured to the yoke 1 so as to protrude therefrom (See FIG. 1) while the other is slidably fitted by a coupler 28 with a horizontal hole 38 formed at the supporting arm 21. The upper portion of one of the supporting members 17 is coupled by a coupler 27 with the standing member 26 through the vertical hole 36 in the supporting arm 3 while the other is rotatably supported on a connector rod 11 through a horizontal hole 38 in the standing member 25.

A plurality of band switching push buttons 10 are disposed on the front face of the yoke 1 in addition to a series of push buttons 5 thereon and the switching plate 6 supported by the supporting mechanism 7 is caused to go up and down by pushing operation for any of said push buttons 10. For this purpose, engaging long holes 12, 12a are formed in a crossed manner each other at slide members 8 to which these push buttons 8 are attached, into which the above mentioned connecting rod 11 is inserted to connect between both standing members 25 and thereby to couple them with the supporting mechanism 7. Further, bearing members 14 are mounted on portions of the rod 11 engaging with the long holes 12, 12a as shown in FIG. 6 to facilitate the slid action therebetween and a spring coil 15 is disposed between both bearing members 14.

Narrow end portions of the slide members 8 are inserted into passage holes 43 formed at the front metal fittings 42 of the yoke 1 and the top portions thereof are provided with said push buttons 10. Elastic members 13 such as compressed springs are disposed between the front metal fittings and the push buttons 10 to provide a return action of the push button 10 and a lock action of the switching plate 6 caused to go up and down. In FIG. 2, a reference numeral 23 shows a niche for engaging with the arm 3.

In the above mentioned arrangement, when any of the push buttons 5 for selecting desired bands is pushed, any of the selection levers placed at both sides of the arm 3 is pushed and the rotating yoke is rotated by the frequency definition plate 18 in the pushed selection lever to insert the core 22 into or to take it out of the coils 2 through a moving member so as to provide a selected tuning condition. In this case, according to the invention, the engagement between the arm 3 and any of the selection levers 4 can be attained by the push buttons 10 for switching received bands. That is, when any of the push buttons 10 is pushed, the slide member 8 secured to this push buttons 10 is pushed and thus due to a guide action of the engaging long hole 12 or 12a formed at this slide member 8, the connecting rod 11 is caused to go up and down. For example, in a condition as shown in FIG. 1 where the right push button 10 has been pushed, in order to switch the received bands, the left push button 10 must be pushed against the spring 13 so that the connecting rod 11 is pushed down due to the tilted engaging long hole 12a, and this causes the engaging position of the connecting rod 11 and the engaging long hole 12 relating to the push button 10 which has been already pushed, to gradually move downwards and at this time since a pushing force is not applied to said pushing button 10 and the illustrated right push button 10 and its slide member 8 are always subjected to a returning action due to the spring 13, said push button 10 returns to be protruded from the yoke whereby the above pushing operation of the illustrated left pushing button 10 can be very easily effected and the pushing down operation of the connecting rod 11 can be smoothly done.

On the contrary, when the illustrated push button is pushed as shown in FIG. 1, the pushing up action by the engaging long hole 12 is applied to the connecting rod 11 and in this way the connecting rod 11 can be caused to go up or down by pushing any of the push buttons 10. When the connecting rod 11 is caused to go up or down as mentioned above, this makes the switching plate 6 go up or down through the horizontal hole 38 in the standing member 25. Even if the inserted portion of the connecting rod 11 is one side portion of the switching plate 6, since the supporting mechanism 7 comprises two crossed supporting members 17 and in that crossed part they are coupled by the coupler 30, when the top portion of one of the supporting member 17 is caused to go down, the other is also caused to go down through said coupler 30. Further it is guided in the direction of the long hole 36 or 38 to render a crossing angle between both members 17 vary and afterall they are caused to go up or down while the switching plate 6 remains in a horizontal condition. As described above, when the switching plate is caused to go up or down, the engaging member 9 slidably inserted into the engaging hole 16 is rendered to go up or down so that the engaging portion 19 engages with or is released from the engaging niche 24 formed at the base end portion of the selection lever 4 positioned in the right side or the left side of the arm 3. That is, the condition shown in FIG. 6 indicates that the engaging body 9 is caused to go down by the switching plate 6 and then engages with the engaging niche 24 in the upper portion of the right selection lever 4. In this case, when the engaging body 9 is caused to go up, its engagement with the right selection lever 4 is released and in turn the engaging portion 19 engages with the engaging niche 24 formed at the lower side of the selection lever 4. Accordingly, since the engagement with the selection lever 4 is switched, even if the same selection push button 5 is pushed, thereby a different selection band is obtained.

Example 3

FIGS. 8 to 10 show the main part of the Example 3 of the invention. In FIG. 8, tuning coils 2 and selection levers 3 ~ 7 are attached to the yoke 1, the front face of which is provided with a escutcheon 8. A rotary crank 9 is rotatably mounted between both side plates 1' and 1'' of the yoke 1 and is linked with an attaching rod 11 of a tuning core corresponding to the tuning coil 2 through a connecting rod 10. An L-like metal fitting 12 is secured to the rotating shaft 13 of the rod 11, thereby to cause the L-like metal fitting 12 to rotate so that the connecting rod 14 of a dial pointer 14' is slided in the left or right direction when said attaching rod 11 is moved.

In the both side positions of each of said selection levers 3 to 7, arms 15 to 19 for selecting any of AM broadcast bands and arms 20 to 24 for receiving any of FM broadcast bands are disposed, respectively, and are attached to the yoke 1.

As shown in FIG. 9, the top portion 25 of the selection lever 3 is adapted to be inserted into an assembling hole at the side of the yoke 1 to which the tuning coil is secured. A spring 26 for returning the lever 3 is disposed between the yoke 1 and the protruded portion 3' of the selection lever 3. Similarly, springs 27 and 28 are mounted on arms 15 and 20, respectively. These arms 15 and 20 are provided with spring plates 28 and 29, respectively, thereby to fix fan-shaped cams 30 and 31 thereto at a constant angle. These fan-shaped cams 30 and 31 engages with the rotary crank 9 as mentioned above, thereby to define the moving distance of the core in the corresponding tuning coil in accordance with the fixed positions of said fan-shaped cams. Firstly said cams are rotatably attached to the arms 15 and 20 by a spindle like 32 and are fixed thereto by a spring plates 28 and 29 after setting the angle thereof. In addition, these arms 15 and 20 are disposed at both sides of the selection lever 3 provided with the selection button 33 as previously described and a switching slide plate 34 is slidably secured to the side of the selection lever 3 by an engaging pin 35, said plate 34 having a long hole 36 thereby to allow said pin to go up and down therein by a constant distance. A positioning mechanism for keeping the sliding distance of this switching slide plate 34 constant and for positioning it at a proper position is provided and positioning grooves 37 and 37' are provided therein. The engaging grooves 37 and 37' are used to properly fit engaging rods 38 and 38' provided in the slide plate 34 to engaging grooves 39 and 39' of the arms 15 and 25 when the switching slide plate 34 slides up and down and a positioning pin 40 is engaged with them. This positioning pin 40' is provided with a spring 40 and thus has a returning capability so that it moves back and forth along slopes of the positioning grooves 37 and 37' to set the slide plate 34 in a proper position.

The switching slide plate 34 is slided up or down by the engaging rods 38 and 38' to cause the selection lever 3 to mechanically couple with any of the arms 15 and 20 and plates 41 and 42 as shown in FIGS. 8 and 10 are disposed above and below the portion to which this switching slide plate attached, respectively.

These plates 41 and 42 are rotatably mounted on rotary axes 45 and 46 provided with springs 43 and 44, the plate 41 being adapted to be rotatable counter-clockwise about the rotary axis 45 and to be rotated clockwise by the spring 43 so that it may be set in a constant position. An L-shaped metal fitting 47 is secured to the near central portion of the plate 41 and an engaging rod 48 is fixed on the fitting 47. Similarly, the other plate 42 is adapted to be rotatable clockwise about the rotary axis 45 and is provided with a spring 44 to apply a rotating bias force counterclockwise thereto. Further a metal fitting 49 is fixed on the plate 42 and on the top portion thereof is fixed an engaging rod 50. The metal fitting 49 extends upwards to a position equal to that of said engaging rod 48 through a slit 41' formed at the plate 41 and both engaging rods 48 and 50 are adapted to be located in the same horizontal position. The engaging rods 48 and 50 are adapted to engage with taper faces 51' and 52' formed at switching plates 51 and 52 which are provided with springs 53 and 54 connected to band switching push buttons 55 and 55', respectively.

Further, protruded lugs 56 and 56' are formed on these plates 41 and 42 and are engaged with a movable contact 58 in a band switching limit switch 57 mounted on the side of a tuner device.

In the above arrangement of the invention, when it is desired to effect switching operation for received bands, firstly there is operated one of the push buttons 55 and 55' which are adapted to automatically return to a original position by springs 53 and 53'. If push button 55 is used to select an FM band, the tapered face 52' of the switching plate connected to the push button 55 comes into contact with the engaging rod 48 by pushing it. The engaging rod 48 contacting with this tapered face 52' moves down along the face 52' and thereby the plate 41 rotates counterclockwise about the axis 45. When the plate 41 rotates in this manner, the switching slide plate 34 shown in FIG. 9 is pushed down. All of the switching slide plates 34 provided on the respective selection levers 3 to 7 operate as mentioned above, thereby to cause all of the selection levers 3 to 7 to be connected to each of the arms 20 to 24. At the same time the protruded lug 56 of the plate 41 switches a limit switch for band selection to an FM super-short wave band side position. In this way the tuner device may be accommodated to receive the broadcast of an FM super-short wave band.

On the other hand, when it is desired to receive the broadcast of an AM middle wave band, the push button 55' is pushed. In this case, the taper face 51' of the switching plate 51 comes to contact with the engaging rod 50 so that the rod 50 moves upwards along the taper face 51' and the plate 42 is lifted up to rotate clockwise about the rotary axis 46. This causes the plate 42 to slide all of the switching slide plates upwards, thereby to release the selection lever 3 to 7 from connection with the arms for FM selection and to connect them with the arms 15 to 19, respectively. As a result, a tuner device may be accommodated to select any of present broadcasts by operating any selection button where the band switching limit switch 57 is switched to an AM side position by the protruded plate 56'.

Example 4

FIGS. 11 and 12 show the main part of Example 4 of the invention. As shown in FIG. 12, a plurality of arms 1 having push buttons 5 secured to the top portion thereof are disposed in an aperture 23 formed at the lower part of a yoke 6 and selection levers each consisting of a lever body 2 and a slide metal fitting 3 are placed at both sides of the arm 1. Engaging niches 12 are provided at the top and bottom of the base end portion of the slide metal fitting. The engaging portion 14 (14a) of the engaging body 4 fitted in the engaging niche 11 formed at the arm 1 is mounted in said engaging niche 12. Namely, the engaging body 4 slides up and down in the direction crossing on the slide direction of the push button arm 1 and this slide operation is done to be guided by the engaging niche 11 so that said body is slided within the range between condition where it is inserted into the interior of said niche and condition where it is suitably raised therefrom as shown in FIG. 12. Said engaging portion 14 engages with the upper engaging niche 12 in one of the selection levers in its descended condition as shown in FIG. 12 due to the slide action upwards and downwards and the engagement of said portion 14 is released by raising it so that the engaging part 14a may be engaged with the lower engaging niche 12 of the other selection lever. In the Example 4 of the invention, in order to effect the switching of the previously described engaging body 4, the arrangement shown in FIG. 11 is employed. That is, said engaging bodies 4 are disposed relative to the respective push button arms 1 as shown in FIG. 11 and the switching plate 7 is adapted to be elevatably guided in long holes 17 at its both sides by guides 16 secured to the inside of a yoke front plate 6 relative to each of engaging bodies 4 placed in this manner. A supporting groove 20 is formed at a bended portion 27 in said switching plate 7 through each of apertures 21 and a slit 15 formed at the top of said engaging body 4 is fitted on this supporting groove 20. In addition, said switching plate 7 is provided with inserting holes 19 into which the base end part of a band switching piece 8 mounted on the mounting seat 10 of the yoke 6 is inserted, and a manipulating knob 9 is attached to a protruded part from the yoke front face plate 6 of said band switching piece 8.

The top mounting portion 18 of said piece 8 is inserted into and mounted on a mounting hole 22 formed at a yoke supporting seat 10 and a reference numeral 24 shows an engaging niche engaging with a switching position definition member (not shown) provided on a push button 5.

In the above arrangement, operation according to the Example 4 of the invention will be explained as follows. Each of engaging bodies 4 is moved and operated up and down, respectively, by switching the band switching piece 8 by means of its knob 9 upwards and downwards, and thus any of the pair of engaging portions 14 and 14a formed at this engaging body 4 is caused to engage with said selection lever. That is, the engaging portion 14a engages with the other selection lever when the engaging body 4 raises and the engagement with the other selection lever is released due to descent of it so that the engagement with the other selection lever is constituted as shown in FIG. 12. In any of such conditions it is apparent that switching of the push button arm 1 and selection operation by the selected lever when the arm 1 is pushed may be obtained.

Example 5

FIGS. 13 to 16 indicate the main parts of the Example 5 of the invention. In FIG. 13, a yoke front plate 1 is provided with a plurality of push buttons 2 to which arms 3 are secured and are adapted to enter into a tuner device to select any of broadcast bands by pushing operation of any of said buttons 2. A pair of selection arms 3 each comprising a lever body 30 and a slide metal fitting 10 is provided at both sides of this arm 3 as shown in FIG. 15. An engaging body 8 is fitted on an engaging portion 12 so as to be slidable in the upward and downward directions crossing on the slide direction of said arm 3 and is provided with two engaging protrusions 18 and 18a each being disposed in upper and lower positions at its both sides. Further another engaging portion 17 is formed at the top of said body 8 and said engaging portions 18, 18a is so arranged that one thereof is disposed above an engaging part 25 formed at the base end portion of the slide metal fitting 10 of the selection lever and the other is disposed below it, thereby to select and engage any of said portions with the switching plate 4 due to up and down actions thereof. Said engaging portion 17 is adapted to engage ith an engaging groove 14 in a horizontal bended portion 24 in the lower end of the switching plate 4 and guide long holes 19 are formed at both sides of said switching plate 4, into which stoppers 9 provided on the yoke front plate 1 are inserted to slide said switching plate 4 up and down. Moreover, the band switching body 6 mounted on the yoke supporting seat 11 in its base end part is attached to the switching plate 4 through inserting holes 26 shown in FIG. 14 and a knob 7 secured to the pointed end of said switching body 6 is protruded from the front plate 1. The switching action of said switching plate 4 may be obtained by switching operation of said knob 7 as indicated with an arrow in FIG. 13. Further, an error operation preventing plate 5 is secured to the front plate 1 and has a plurality of holes 15 at positions corresponding to the positions in which said engaging bodies 8 are disposed while a protrusions engaging with said hole 15 is provided in the upper end portion of the engaging body 8.

In the above arrangement, the switching plate 4 is caused to go up and down by switching the band switching body 6 upwards and downwards so that the engaging body 8 engaging with the engaging groove 14 is moved up and down remaining to engaging with the arm 3 thereby to ender any of the engaging protrusions 18 and 18a to engage with the slide metal fitting 10 of the selection lever placed at both sides of the arm 3, and then the selection lever selected in this way is inserted into a tuner apparatus by pushing any of push buttons 2 to select a desired broadcast band. In order to alter the setting of a frequency definition plate in the selection lever, the push button 2 and then the slide metal fitting 10 engaging therewith through the engaging body 8 is drawn to this side in FIG. 15 so that only the slide metal fitting 10 is taken out of a lever body 30 thereby to release the frequency definition plate from the setting thereof and to make it be in free condition, and thus alteration of the setting of said plate is allowed. In this condition, the protrusion 20 of the engaging body 8 is engaged with any of said holes 15 as is apparent from FIG. 15 and thus the engaging body 8 is fixed to this position so that the band switching body 6 may not be switched by the knob 7. In other words, error operation of said body 6 can be prevented in such condition.

Example 6

Figure 17:
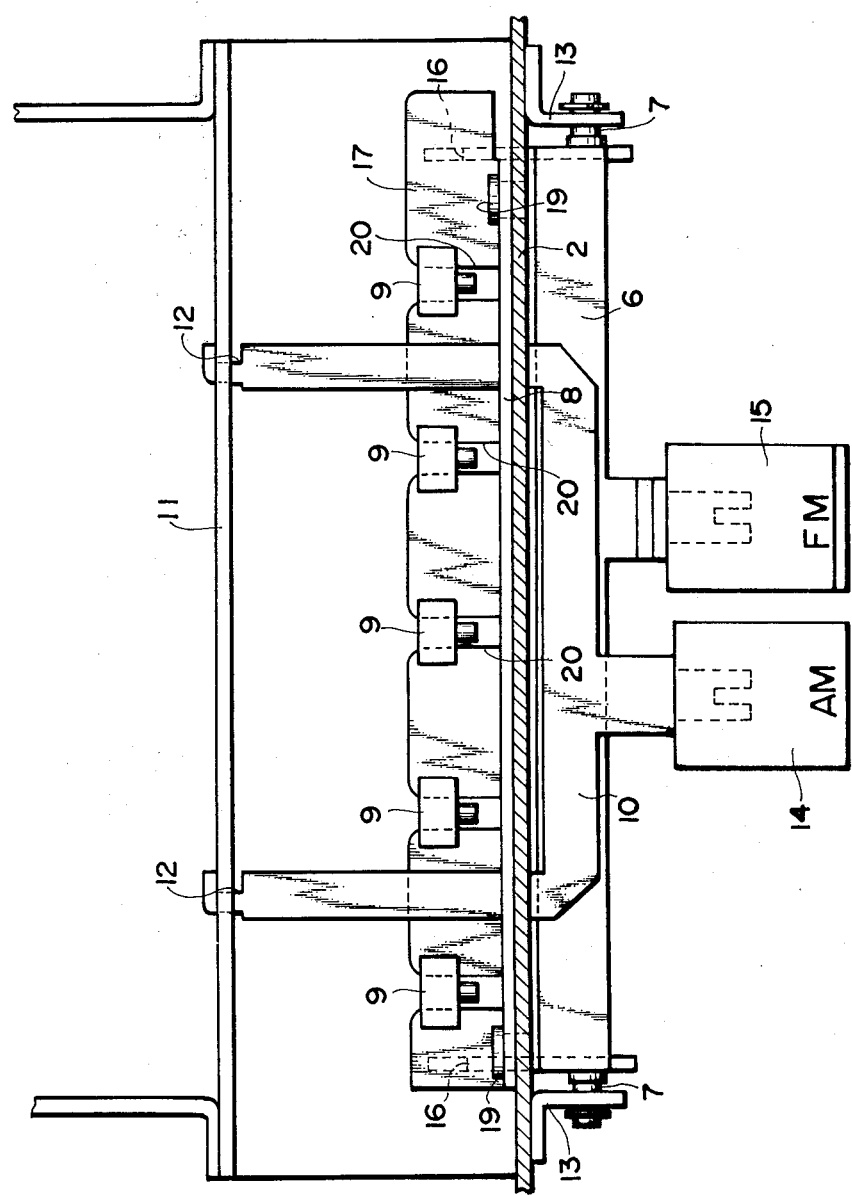
FIG. 17 is a perspective view showing the front part of a push button type tuning device comprising a receiving band switching mechanism according to the Example 6 of the invention.
Figure 19:
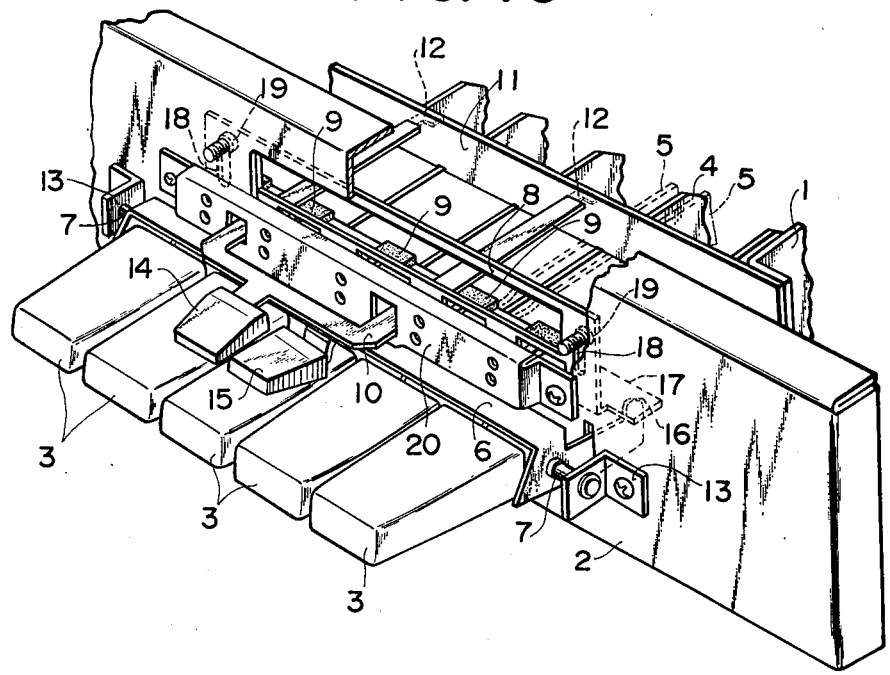
FIG. 19 is a side view showing said Example 6.

FIGS. 17 to 19 show the main parts of the Example 6 of the invention. In FIG. 19, a plurality of push buttons 3 for effecting selective tuning operation with one touch therewith are provided in a front plate 2 secured to a yoke 1 and attached to pointed ends of arms 4. A pair of slide pieces 5 as selection levers pushed together with said arm 4 in accordance with a switched and received band is disposed at both sides of said arm 4. An engaging member 9 for selecting any of said slide pieces 5 and for engaging selected one with said arm 4 is adapted to engage with an engaging groove 20 (FIG. 17) formed at a bended portion 17 in the lower rim of a switching member 8 appended to the inside of the front plate 2 of the yoke 1. Stoppers 19 are inserted into long holes 18 formed at both sides of the switching member 8 to cause it to be capable of going up and down and when said engaging member 9 is raised by the switching member 8, the member 9 causes the slide piece 5 at one side of the arm 4 to engage with it. On the contrary, when said engaging member 9 is descended, the engagement between the above piece 5 and the arm 4 is released and then the engagement between the other slide pieces 5 and the same arm 4 is constituted.

In this case, in order to attain switch operation due to going up and down of the switching member 8, first and second pushing operation pieces 10 and 6 are used. The base end portion of the first pushing operation piece 10 mounted on a mounting seat 11 provided with in the yoke 1 and the intermediate portion of the second pushing operation piece 6 is mounted between a pair of axis seats 13 disposed on the front plate 2 by mount axis 7. Operation buttons 14 and 15 are secured to intermediate portions of the first and second pushing operation pieces 10 and 6, respectively and are placed above the push buttons 3, receiving portions 21 are protruded at both sides of said bended portion 17 as shown in FIGS. 17 and 18, and a pushing protrusion 16 in the pointed end of the second pushing operation piece 6 contacts with the lower face of each receiving portion 21 thereby to operate the switching member 8 in the upward direction opposite to the downward operational direction of the first pushing operation piece 10.

According to the above Example 6 of the invention, smooth switching can be attained by operating the operational buttons 14 and 15 in the so-called piano touch manner in switching receiving bands. That is, when the operational button 14 is pushed, the switching member 8 is caused to go down to engage the member 9 with the slide piece 5 corresponding to the arm 4 and the pushing protrusion 16 is depressed by the receiving portion 21 to raise the operational button 15. On the contrary, it is possible to raise the switching member 8 so as to engage the member 9 with the other slide piece 5 and at this time said operational button 4 may be raised and returned.

Example 7

Figure 20:
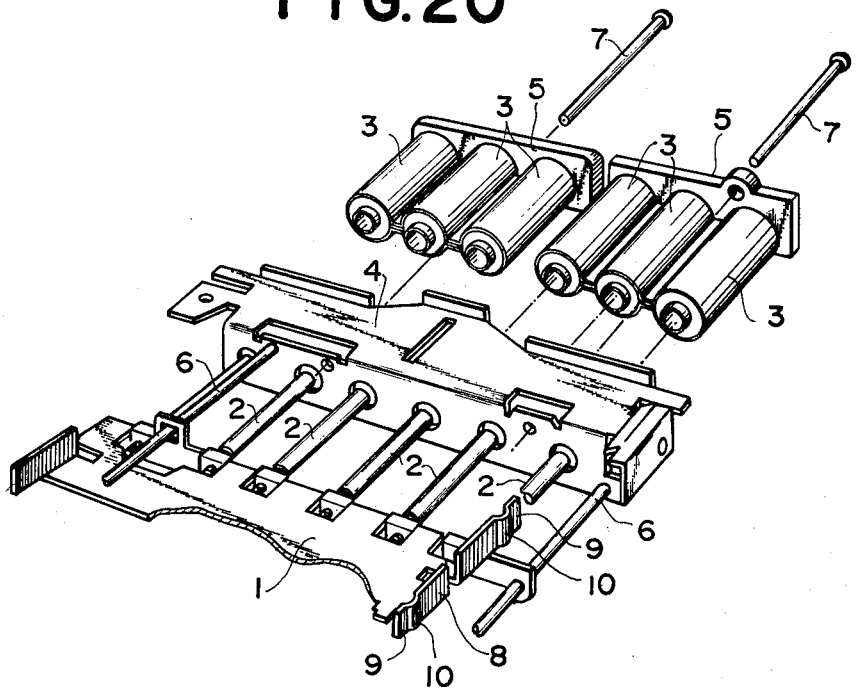
FIG. 20 is a perspective view showing coars and coils in a push-button type tuning device according to the Example 7 of the invention.

FIG. 20 shows the main part of the Example 7 of the invention. A moving plate 1 is provided with a plurality of cores which are adapted to be inserted into and drawn from a plurality of tuning coils 3 and standing portions 8 are formed at the sides of the moving plate 1. In order to isolate only the standing portion 8, slits are formed at a portion near the end 9 of the standing portion 10 or said portion 10 is protruded therefrom and a bended portion 9 is formed at this portion 10.

In addition, reference numerals 6 shows guiding rods, one of which is attached to the upper position in an upper face plate 4 for covering said coils 3 and the other is attached to the lower position of said plate 4 as shown FIG. 18 to guide the moving plate 1.

In the above example, the bended portion 10 may be made slightly large. In adjusting and setting a core stroke, said bended portion 10 may be extended or compressed by a tool such as a radio-pincers to suitably vary a bended degree thereof and this operation is very simple.

Example 8

Figure 21:
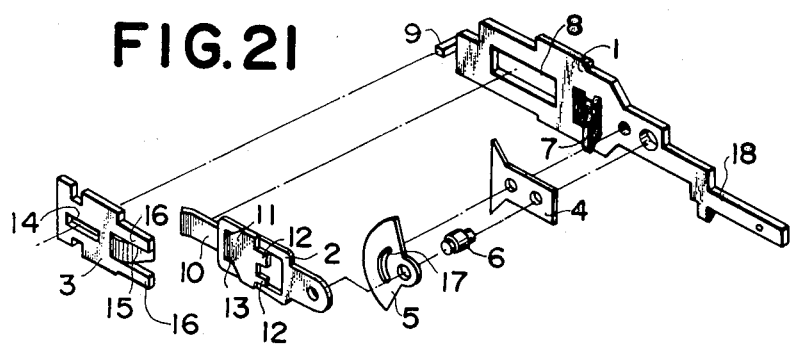
FIG. 21 is a perspective view showing each component of the main part of the Example 8 of the invention.
Figure 22:
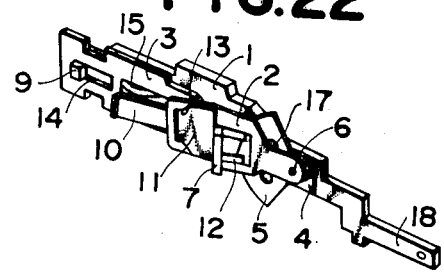
FIG. 22 is a perspective view showing an assembled condition of said each component.

FIGS. 21 and 22 show the main part of the Example 8 of the invention. A coarse face plate 4 is secured to an arm member 1 at the pointed end of which an inserting part 18 is formed as shown in FIG. 19 and a frequency definition plate 5 is mounted on the plate 4, the base part thereof being rotatably attached to the plate 4 and the member 1 by a coupler 6. Said definition plate 5 is fixed on the coarse face plate 4 of said arm member 1 by a holding plate 2 on which an elastic plate 11 is mounted using an aperture 13 formed at the plate 2, a pressing part 12 being formed at one end of the elastic plate 11 and an extending part 10 being formed at the other end thereof. Said arm member 1 is provided with a slide metal fitting 3 at the center part of which a long hole 14 is formed, and a protrusion 9 provided at the pointed end part of the arm member 1 is engaged with said long hole 14 to define a sliding range of the slide metal fitting 3. Further the extending 10 of the elastic plate 11 is adapted to run on a bent part formed at said slide metal fitting. That is, when the slide metal fitting 3 is sufficiently pushed in as shown in FIG. 22, the extending part 10 completely runs on the bent part 15 thereby to press the definition plate 5 against the coarse face 4 of the arm member 1 and the in this state said extending part 10 is caused to fall in the lower portion of the bent part 15 by drawing the slide metal fitting 3 so that said pressed condition is released and the definition plate 5 becomes freely rotatable.

In addition, in FIGS. 21 and 22, a reference numeral 7 shows a stopping part with which the pressing parts 12 engaged as shown in FIG. 21 and a reference numeral 17 shows a circular hole for defining the rotatable range of the definition plate 5.

According to the above Example 8 of the invention, since the coarse face part is formed at the arm member 1 itself by such as a coarse plate and the definition plate 5 at which a coarse face part similar to the above is formed, is pressed against the coarse face part of the arm member 1, an extremely secure contacting condition using an elastic plate member can be provided between the arm member 1 and the definition plate 5.

Figure 23:
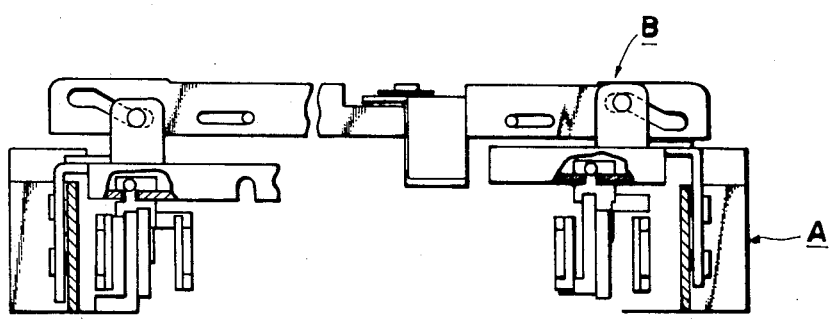
FIG. 23 is a schematic plain view showing the modification of said Example 1.
Figure 24:
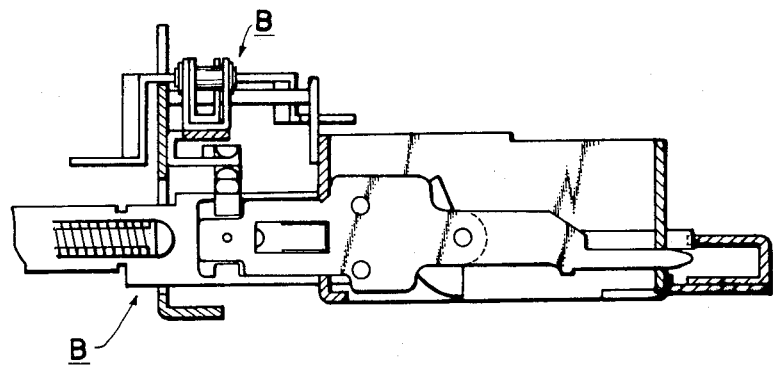
FIG. 24 is a schematic side view showing said modification.
Figure 25:
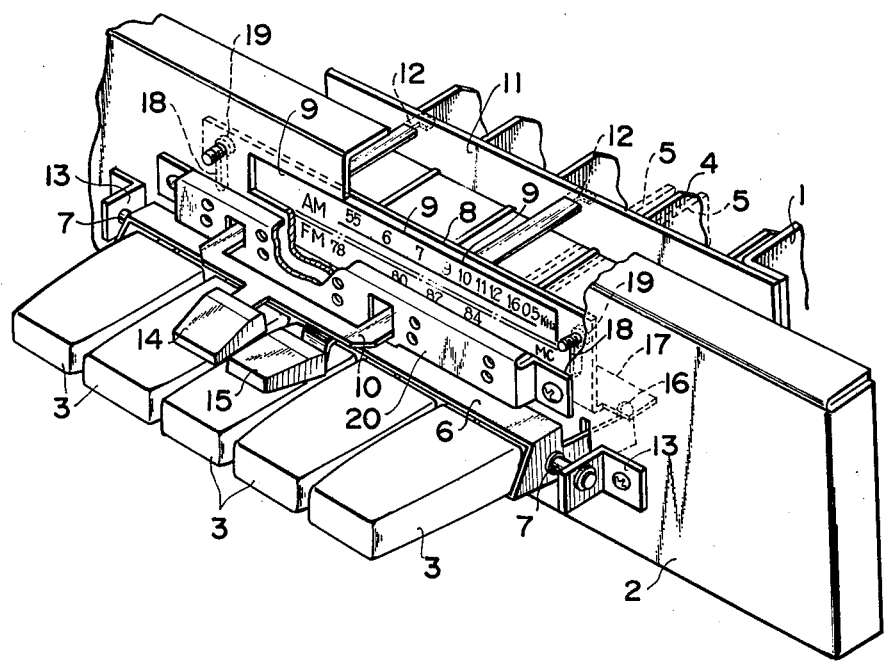
FIG. 25 is a perspective view showing the front part of the modification of the Example 4.

While the principles of the invention have now been made clear in the illustrative examples, there will be many obvious modification of the structure, proportions, materials and components without departing from those principle. For instance, the Example 1 may be so modified as to comprise a longitudinal switching mechanism A and a lateral slide mechanism B for converting a longitudinal switching action by said mechanism A to a lateral slide action as shown in FIGS. 23 and 24. Moreover, the Example 4 may be so modified as to have a received frequency indicator 9 as shown in FIG. 25. The appended claims are intended to cover any such modifications.

What is claimed is:

1. In a tuning device capable of being tuned to encompass frequencies in at least two frequency bands; a pair of manually operable band selection members to be operated respectively to set the device to frequencies in said respective frequency bands; individual manually operable frequency selection members; operating means respectively coupled to said frequency selection members to be moved back and forth thereby; a pair of band selection responsive members on opposite sides of each of said operating means and each adapted when moved by said operating means to tune a circuit to the selected frequency; the improvement in apparatus for selectively rendering movable therewith one or the other of said band selection responsive members on the opposite sides of each operating means, said apparatus comprising: engaging means associated with each pair of band selection responsive members and mounted for movement with the operating means of the associated frequency selection member and movable relative thereto to opposite extreme positions in directions transversely to the direction of movement of said operating means of the associated frequency selection member to make motion coupling engagement with one or the other of the associated band selection responsive members; band switching means for selectively moving said engaging means back and forth between said opposite extreme positions, thereby causing it to engage with one or the other of the associated pair or selection members, said band switching means including first and second manually operable band selection members, and switching means for moving all the engaging members in one direction when said first band selection member is operated and for moving all the engaging means in the opposite direction when the second band selection member is operated; and separate spring means associated with each band selection member for respectively forcing the same to return to an initial position so operation of one of said band selection members moves the said switching means to one extreme position against the restraining force of the associated spring means and operation of the other band selection member moves the switching means to another extreme position against the restraining force of the associated spring means.

2. The tuning device of claim 1 wherein said switching means includes a switching member carrying all of said engaging means for movement therewith in one direction, said engaging means being slidable therealong in a direction transverse to said one direction; first and second action pieces guided for movement in a direction transverse to the direction of movement of said switching member and respectively coupled with the first and second band selection members, said action pieces being provided with tilted elongated slots formed therein in a crossed manner and through which an operating rod passes; and means coupling said operating rod to said switching member.

3. A tuning device comprising frequency selection members for respectively selecting a number of frequencies in either one of two frequency bands; an operating arm coupled to each frequency selection member; a pair of band selection responsive members disposed on opposite sides of each operating arm; a switching slide mounted on the side of each operating arm for sliding movement transversely thereto and having an operating rod which in one extreme position makes engagement with one of the associated band selection responsive members and in the opposite extreme position makes engagement with the other associated band selection responsive member, each of said band selection responsive members on one side of said operating arms upon movement thereof by operation of the associated frequency selection member effecting a tuning operation at a pre-selected frequency within one of said frequency bands and each of the band selection responsive members on the other side of said operating arms upon movement thereof by operation of the associated frequency member effecting a tuning operation at a pre-selected frequency within the other frequency band; a pair of operating members provided on opposite sides of all of said switching slides and positioned to push the slides in opposite directions when one or the other of said operating members is moved outward; spring means urging said operating members inward; means carried on one of said operating members for moving all of the switching slides to one extreme position when the operating member is moved outward and means carried in the other operating member for moving all of the switching slides to the opposite extreme position when the other operating member is moved outward; a pair of manually operable band selection members; and a pair of switching means coupled with said band selection members and having tapered faces respectively engaging said operating members and moving the same outward in opposite directions when the band selection members are operated.

4. The tuning device of claim 3 wherein there is provided additional band switching means respectively responsive to the outward movement of said operating members to provide additional band switching operations.

5. The tuning device of claim 3 wherein each of said operating arms has an engaging groove in which a rod extending from the associated switching slides is guided for movement, and said operating members being pivotally mounted members.

6. In a tuning device comprising means tunable to frequencies encompassing at least two frequency bands; individual frequency selection controls; operating arms respectively coupled for longitudinal movement by said frequency selection controls; a pair of band selection responsive members disposed on opposite sides of each operating arm; means movable in response to movement of said band selection responsive members to vary said tuning means; an engaging member mounted for up and down movement relative to each operating arm and bodily movable longitudinally therewith, and in an upper position thereof operatively engaging one of the associated pair of band selection responsive members to couple the longitudinal movement of the associated operating arm thereto and in a lower position operatively engaging the other band selection responsive member of the associated pair of such members to couple the longitudinal movement of the associated operating arm thereto; and manually operable band switching means including a switching member coupled to all of said engaging members to move the same between said upper and lower positioned when moved respectively up and down, said engaging members being slidable relative to said switching member in a generally horizontal direction, and manually engageable means for selectively moving said switching member up and down.

7. The tuning device of claim 6 wherein said manually engageable means comprising first and second push buttons, and there is provided first means responsive to depression of said first push button for effecting movement of said switching member upward, and second means responsive to depression of said second push button for moving said switching member downward.

8. In a tuning device comprising a tuning means tunabel to frequencies encompassing at least two frequency bands; individual frequency selection controls; operating arms respectively coupled for longitudinal movement by said frequency selection controls; a pair of band selection responsive members disposed on opposite sides of each operating arm; means movable in response to movement of said band selection responsive members to vary said tuning means; an engaging member mounted for movement transversely of each operating arm and bodily movable longitudinally therewith and in one extreme position thereof operatively engaging one of the associated pair of band selection responsive members to couple the movement of the associated operating arm thereto and in an opposite extreme position operatively engaging the other band selection responsive member of the associated pair of such members to couple the longitudinal movement of the associated operating arm thereto; and manually operable band switching means comprising a switching member coupled to all of said engaging members to move the same between said extreme positions when moved respectively in opposite directions; said engaging members being movable along said switching member in a direction transversely to said opposite directions, first and second manually depressible members, first means responsive to depression of said first depressible member to effect movement of said switching member in one of said opposite directions, and second means responsive to depression of said second depressible member for moving said switching member in the other of said opposite directions.

9. The tuning device of claim 8 wherein said first depressible member is a lever pivoted at the inner end thereof and said second depressible member is a lever pivoted between the ends thereof, and said switching member being coupled to portions of both of said levers at points spaced from the pivot points thereof to provide movement in opposite directions upon similar depression of the outer ends of the levers.

10. The tuning device according to claim 8 wherein said first means responsive to depression of said first depressible member includes a member provided with a tilted elongated hole, said second means responsive to depression of said second depressible member includes a member provided with a tilted elongated hole in crossing alignment with said first mentioned tilted elongated hole, and said switching means further includes a rod passing through both of said elongated holes and coupled to said switching member.

11. A tuning device comprising individual manually operable frequency selection controls; operating arms respectively coupled to said individual frequency selection controls to be movable thereby in a given direction; a pair of band selection responsive members positioned on opposite sides of each operating arm and each adapted to tune a related circuit to frequency in a selected frequency band; engaging means carried by each operating arm and movable therewith in said given direction and mounted for movement thereon in a direction transverse to the direction of movement thereof to opposite extreme positions, each engaging means when in one of said extreme positions coupling the movement of the associated operating arm to one of said associated band selection responsive members, and when in the other extreme position coupling the movement of the associated operating arm to the other associated band selection responsive member; manually operable band selection means having two conditions of operation; first means responsive to one of said conditions of operation of said band selection means for simultaneously moving all of said engaging means to one of said extreme positions and responsive to the other of operation of said band selection means for simultaneously moving all of said engaging means to said other extreme position; and releasable band switching locking means for preventing the change of position of said engaging means by said band selection means, said band switching locking means including a stationary member into which portions of each engaging means is movable to interlock therewith until operation of the associated frequency selection control.

12. In a tuning device comprising individual manually operable frequency selection controls; operating arms respectively coupled to said individual frequency selection controls to be movable thereby in a given direction; a pair of band selection responsive members positioned on opposite sides of each operating arm and each adapted to tune a related circuit to frequency in a selected frequency band; engaging means carried by each operating arm and movable therewith in said given direction and mounted for movement thereof in a direction transverse to the direction of movement thereof to opposite extreme positions, each engaging means when in one of said extreme positions coupling the movement of the associated operating arm to one of said associated band selection responsive members, and when in the other extreme position coupling the movement of the associated operating arm to the other associated band selection responsive member; manually operable band selection means having two conditions of operation; first means responsive to one of said conditions of operation of said band selection means for siumltaneiously moving all of said engaging means to one of said extreme positioned and responsive to the other condition of operation of said band selection means for simultaneously moving all of said engaging means to said other extreme position, the improvement wherein each band selection responsive member has a deformable bent portion which can be deformed to vary the position of a shoulder formed thereby, and a tuning means associated with each band selection responsive member and engageable by said shoulder so the degree of movement of the tuning means varies with the positioned of said shoulder.

* * * * *